(12) United States Patent
Stoisiek et al.

(10) Patent No.: US 6,310,401 B1
(45) Date of Patent: Oct. 30, 2001

(54) SUBSTRATE FOR HIGH-VOLTAGE MODULES

(75) Inventors: Michael Stoisiek, Ottobrunn; Guy Lefranc, Munich; Reinhold Bayerer, Warstein; Rainer Leuschner, Grossenseebach, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/607,053

(22) Filed: Jun. 29, 2000

(30) Foreign Application Priority Data

Jun. 22, 1999 (DE) .............................. 199 28 578

(51) Int. Cl.$^7$ ..................................... H01L 29/40
(52) U.S. Cl. .................. 257/782; 257/664; 257/699; 257/703
(58) Field of Search ..................... 257/782, 664, 257/703, 699, 700, 710, 712, 713, 609, 698, 704

(56) References Cited

U.S. PATENT DOCUMENTS

| 6,054,762 | * | 4/2000 | Sakuraba et al. | 257/703 |
| 6,124,635 | * | 9/2000 | Kuwabara | 257/703 |
| 6,157,076 | * | 12/2000 | Azotea et al. | 257/679 |

FOREIGN PATENT DOCUMENTS

10335631-A * 12/1998 (JP) .

* cited by examiner

*Primary Examiner*—Nathan Flynn
*Assistant Examiner*—Remmon R. Fordé
(74) *Attorney, Agent, or Firm*—Schiff Hardin & Waite

(57) ABSTRACT

A metallic-ceramic substrate having a ceramic layer and metal layers on both sides of the ceramic layer is provided with a high-impedance layer at the surface of the ceramic layer. The high-impedance layer is located adjacent to the metal layers. Therefore, the electrical field intensity at the edges of the metal layers is limited and an even distribution of the electrical potential at the surface of the ceramic layer is achieved. For example, the high-impedance layer may include a thin CrNi-layer, a doped Si-layer, an a—C:H-layer or a Ti-implantation.

16 Claims, 4 Drawing Sheets

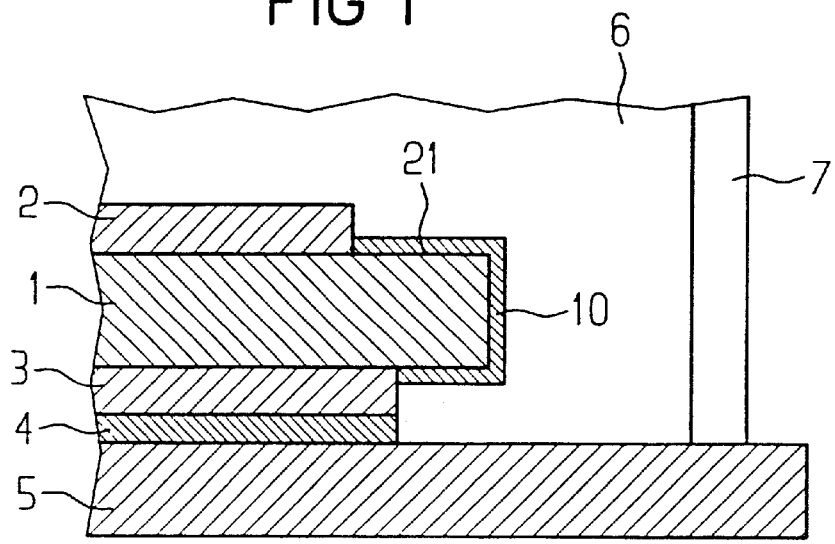
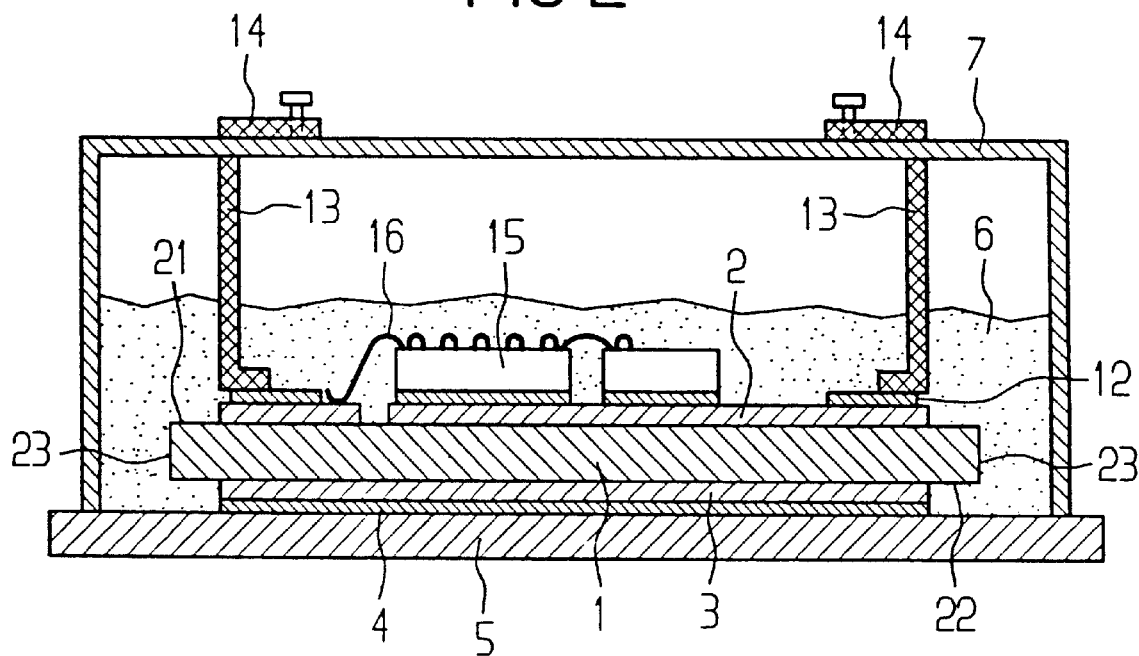

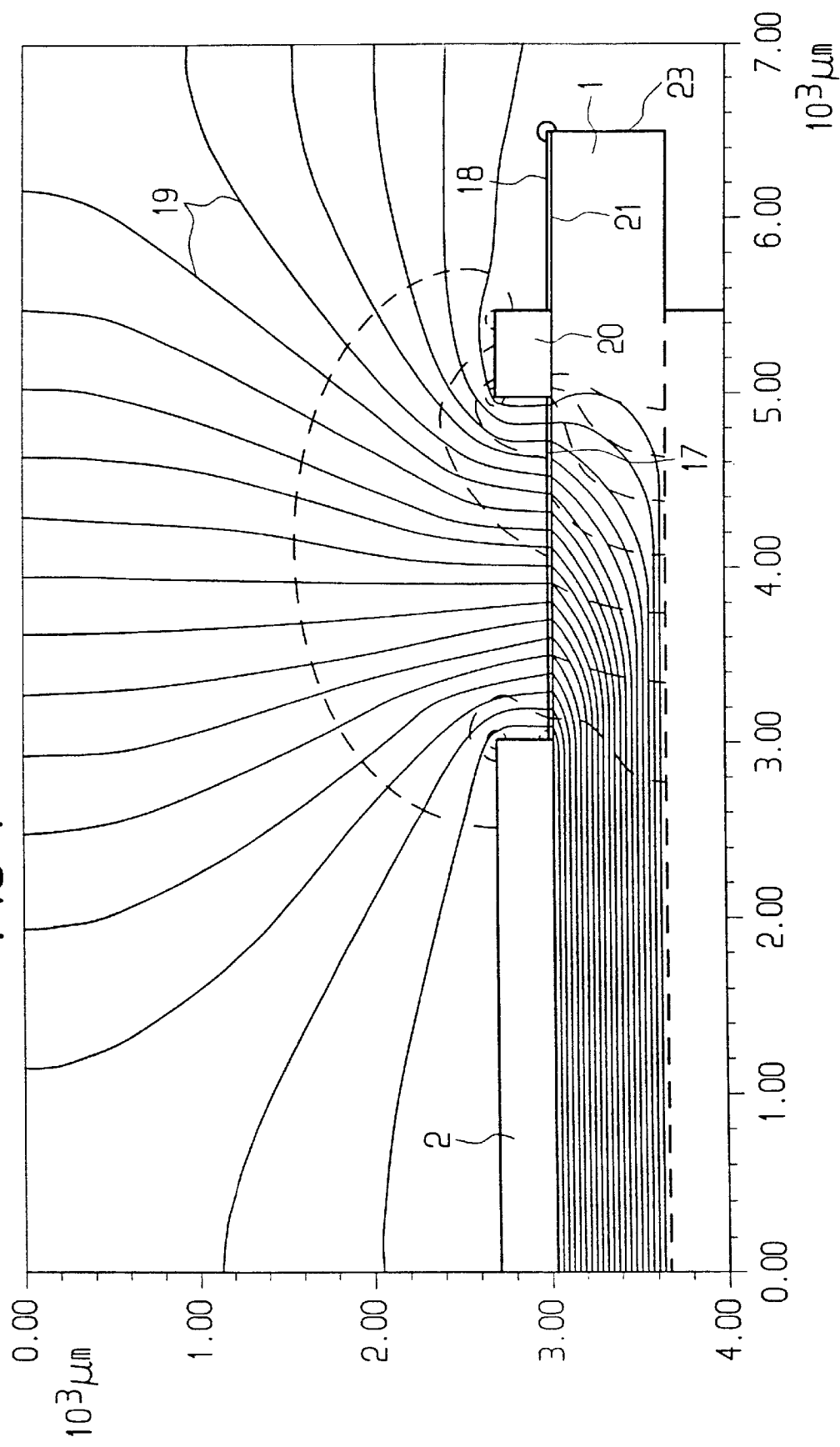

SUBSTRATE FOR HIGH-VOLTAGE MODULES

BACKGROUND OF THE INVENTION

The present invention relates to the improvement of metallic-ceramic substrates for high-voltage modules.

Power semiconductor components, particularly IGBTs, are fixed on a metallic-ceramic substrate. FIG. 2 herein shows a typical unit construction in cross section. The utilized substrate comprises a ceramic layer 1 that normally is comprised of $Al_2O_3$ or AlN, for example. Metal layers that are formed by a copper metallization, for example, are situated on both main sides 21, 22 of this ceramic layer. Given the installation, a bottom metal layer 3 is attached to a bottom plate 5 by means of soldered joint 4, wherein the bottom plate 5 can be made of copper. The power semiconductor components 15, such as an IGBT or a diode, are attached to an upper metal layer 2 by means of a further soldered joint 12. The upper terminal contacts of the power semiconductor components are connected to a separate portion of the upper metal layer 2 by means of a bond wire 16, for example. Electrical inlets 13 that are connected to external contacts for tapping the operating voltage are attached to the upper metal layer 2 by means of further soldered joints 12. The arrangement is situated in a housing 7 that is preferably made of plastic and filled with a casting compound 6. The casting compound 6 serves to electrically insulate the arrangement from the environment.

FIG. 3 herein shows the typical course of the equipotential surfaces on the basis of the cross sections that are given in the area of the edge of the substrate due to the equipotential lines 11. The lateral edges of the metal layers 2, 3 do not coincide with the lateral edge 23 of the ceramic layer 1. Given a typical arrangement, the lateral edge of the upper metal layer 2 is more remote from the lateral edge 23 than the lateral edge of the lower metal layer 3. Therefore, the substrate is fashioned similar to a base. The equipotential lines 11 come out of the first main side 21 of the ceramic layer 1, which is provided with the upper metal layer 2 (as shown in FIG. 3). The electrical field intensity is especially high in the edge region of the metal layers 2, 3 as evidenced by the gradient of the equipotential surface lines, and can reach extreme peak values. These high occurring field intensities at the edge regions of the metal layers are the cause for a high partial discharge of the unit, which, as has been experimentally proven, suddenly begins when a threshold value of the operating voltage has been exceeded. The unit, particularly the casting compound 6, is permanently damaged as a result of such a high partial discharge. Therefore, the high-voltage resistance of the unit is limited.

Present further developments of the IGBT units are directed toward high operating voltages, as they are known from thyristors. The voltages between the casting compound and the electrically active part of the unit assume values above 10 kV, so that more stringent requirements must be met with respect to the insulating power of the units and their longevity.

SUMMARY OF THE INVENTION

The present invention is based on the need for a substrate for high-voltage units that is also appropriate for operating voltages significantly higher than 3 kV.

This need is met by the present invention that includes a substrate for high voltage units including a ceramic layer having a first main side and a second main side that is opposite to the first main side. An upper metal layer is disposed on the first main side and a lower metal layer is disposed on the second main side. A high-impedance layer is also included having at least a portion disposed adjacent to the upper metal layer at the first main side of the ceramic layer. The high-impedance layer also has either at least a portion electrically connected to an electrical conductor that is, in turn, electrically connected to the lower metal layer or another portion disposed adjacent to the lower metal layer. The high-impedance layer effects a degree of electrical conduction between the upper metal layer and the lower metal layer.

According to another aspect of the present invention, a substrate for high voltage modules includes a ceramic layer having first and second main sides, an upper metal layer disposed on the first main side and a lower metal layer disposed on the second main side and electrical conductors disposed at the first main side at edges of the upper metal layer. The electrical conductors are formed such that they are increasingly distanced from the ceramic layer with an increasing distance along a length of the electrical conductors away from the upper metal layer.

According to yet another aspect of the invention, a substrate has a ceramic layer having first and second main sides, an upper metal layer disposed on the first main side and a lower metal layer disposed on the second main side and an electrically conductive bottom plate that is connected to the ceramic layer via the lower metal layer. Further, an edge metallization is disposed at a distance from the upper metal layer on the first main side of the ceramic layer. The edge metallization is entirely surrounding the upper metal layer to form afield emission area and is also electrically connected to the lower metal layer through a low impedance.

The substrate according to the present invention, which comprises a ceramic that layer that is provided with two metal layers, has means following the edges of the upper metal layer at the surface of the ceramic layer, that limit the amount of the electrical field intensity at the edges of the metal layers. Limiting the electrical field intensity at the edges of the metal layers is effected in order to prevent high electrical field intensities occurring at this location and possibly damaging a maximum power unit produced with the substrate. The invention provides, therefore, an even distribution of the electrical potential at the surface of the ceramic layer. For example, equipotential bonding (i.e., even distribution) is caused by an electrically conducting layer that is of sufficient high-impedance and thinness at the top side of the ceramic layer and with which the edges of the upper metal layer are connected to the lower metal layer in a high-impedance fashion. Preferably, this layer is sufficiently conductive in order to also effect a sufficient equipotential bonding with respect to rapid switching processes within the high voltage region (such as typically 6 kV/$\mu$s through 10 kV/$\mu$s). Another exemplary embodiment provides attaching an electrical conductor respectively lateral at the edges of the upper metal layer wherein the electrical conductor is increasingly upwardly bent with increasing distance from a corresponding edge. Alternatively, an edge metallization that is distanced from the upper metal layer and that surrounds the upper metal layer can be provided on the top side of the ceramic layer, wherein the edge metallization is connected to the lower metal layer in a low-impedance manner.

Additional advantages and novel features of the invention will be set forth, in part, in the description that follows and, in part, will become apparent to those skilled in the art upon examination of the following or may be learned by practice of the invention. The advantages of the invention may be realized and attained by means of the instrumentalities and combinations particularly pointed out in the appended claims.

BRIEF DESCRIPTION OF THE DRAWINGS

The present invention is subsequently described in greater detail on the basis of the embodiments explained in the Figures. Shown are:

FIG. 1 illustrates the edge of a preferred embodiment of an inventive metallic-ceramic substrate;

FIG. 2 shows the structure of a known maximum power unit;

FIG. 4 illustrates, in cross section, a further preferred embodiment of a substrate including the curve of the equipotential surfaces;

DETAILED DESCRIPTION OF THE PREFERRED EMBODIMENTS

Figure 3:
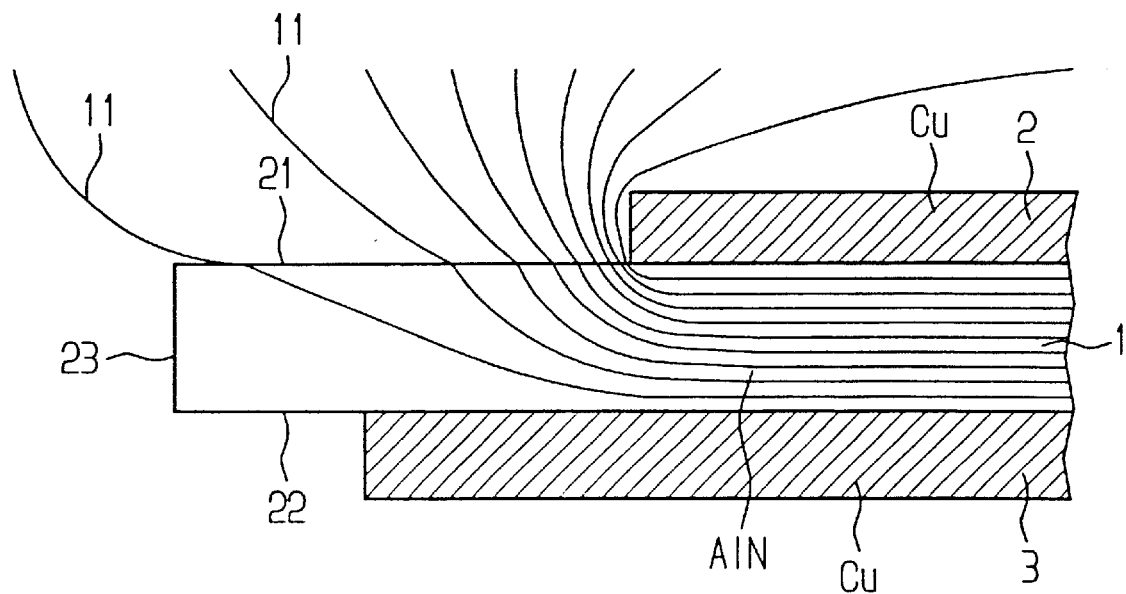
FIG. 3 shows the curve of the equipotential surfaces in a section of the unit of FIG. 2.

FIG. 1 shows in cross section a section regarding the structure of a maximum power unit according to FIG. 2 with an inventive substrate. The substrate is a metallic-ceramic substrate that is comprised of a ceramic layer 1, which is comprised of $Al_2O_3$ or AlN, an upper metal layer 2, which is made of copper, for example, and a lower metal layer 3, which is also made of copper, for example. The soldered joint 4 and the bottom plate 5 of a unit construction are also drawn here. For purposes of producing a unit, the substrate (only the edge is shown here) is preferably cast in a casting compound 6 and arranged in a housing 7.

In a preferred embodiment shown in FIG. 1, a high-impedance layer 10 made of an electrically conductive material, located adjacent to the upper metal layer 2 and is situated on the first main side 21 of the ceramic layer 1. This layer 10 can cover the entire portion of the ceramic layer 1 that is not covered with the upper metal layer 2. The high-impedance layer 10 is connected to the lower metal layer 3 in an electrically conducting manner and, in this embodiment, covers the lateral limits and the second main side of the ceramic layer 1 up to the lower metal layer 3. However, it is sufficient to have a high-impedance layer 10 disposed only on the first main side 21 of the ceramic layer 1 following the edges of the upper metal layer 2. The high-impedance layer 10 in such case is connected to the lower metal layer 3 in an electrically conducting manner such that a potential difference can be present between the upper metal layer 2 and the lower metal layer 3, this potential difference dropping across the high-impedance layer. For example, the layer 10, by means of interconnects, can be connected to the lower metal layer 3 at its outside edges in an electrically conducting manner, namely short-circuited.

The high-impedance layer 10 is preferably adjacent to all edges of the upper metal layer 2, and, therefore, is not only adjacent outside at the edges of the substrate, but also between the potentially several parts of the upper metal layer 2 (as they are shown in FIG. 2). In a preferred embodiment, the high-impedance layer 10 is fashioned such that the amount of the electrical field intensity, at a maximum, is 4 U/mm at the lateral edges when an electrical voltage U is present in the range of 3 kV through 10 kV between the upper metal layer 2 and the lower metal layer 3.

Preferably, the high-impedance layer 10 is a weakly, electrical conducting material. For example, it can be formed by a thin metal layer, whose specific resistance can be adjusted by means of oxidation processes. In particular, CrNi is especially appropriate for this purpose. Instead of metal, electrically conductive, doped amorphous silicon can be utilized whose conductivity can be simply appropriately adjusted by means of the doping concentration (specific resistance typically $10^5 \Omega cm$). This particularly ensues with regard to a sufficient electrical insulation being required, while a fast equipotential bonding is simultaneously requested for switching processes, wherein high voltage increases occur within a short period of time. The precipitation of amorphous carbon a—C: H is also possible, whose conductivity can be intentionally adjusted by means of doping with boron, nitrogen or tin. Instead of depositing a separate layer 10, it can be sufficient to dope a portion of the layer of the ceramic layer 1 to be electrically conductive at least at its first main side 21 by means of a Ti-implantation, for example.

FIG. 4 shows a cross section of a further embodiment representing the ceramic layer 1 and the upper metal layer 2. An edge metallization 20 is attached to the first main side 21 of the ceramic layer 1 so as to entirely surround the upper metal layer 2 and with a distance thereto. The edge metallization 20 is connected to the lower metal layer 3 in an electrically conducting manner, so that the edge metallization 20 lies at the electrical potential of the lower metal layer 3. The high-impedance layer is situated on the fist main side 21 of the ceramic layer 1 between the upper metal layer2 and this edge metallization 20 as inner high-impedance layer 17. In the case of the upper metal layer 2 broken down into a plurality of portions, the inner high-impedance layer 17 is preferably adjacent to all edges of these portions. The inner high-impedance layer 17 can have construction corresponding to a high-impedance layer with respect to the embodiments previously described on the basis of FIG. 1. An outer conductive layer 18 between the edge metallization 20 and the lateral limit 23 of the ceramic layer can be additionally included in the nature of a field plate. The typical course of the equipotential surfaces, when an operating voltage is pending between the upper metal layer and the lower metal layer, is shown by equipotential lines 19.

Figure 5:
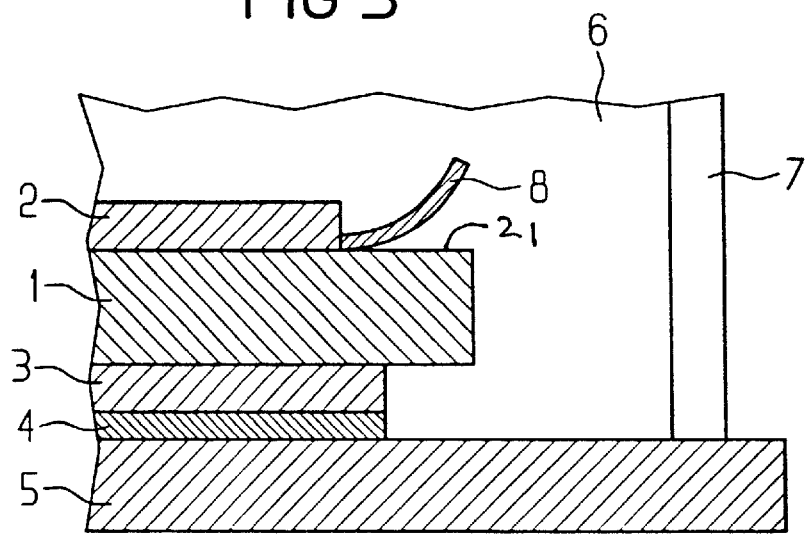
FIG. 5 illustrates yet another preferred embodiment.

An embodiment according to FIG. 5, an electrical conductor 8 is situated on the first main side 21 of the ceramic layer 1, adjacent to the edge of the upper metal layer 2. This electrical conductor 8 connects to the edge of the upper metal layer 2 in an electrically conducting manner and is increasingly distanced from the ceramic layer 1 with increasing distance from the upper metal layer 2. It can have the upwardly bent shaping shown in FIG. 5, for example. This electrical conductor 8 influences the equipotential surfaces at the edge of the upper metal layer 2 since the electrical field vanishes inside of the electrical conductor 8.

Figure 6A:
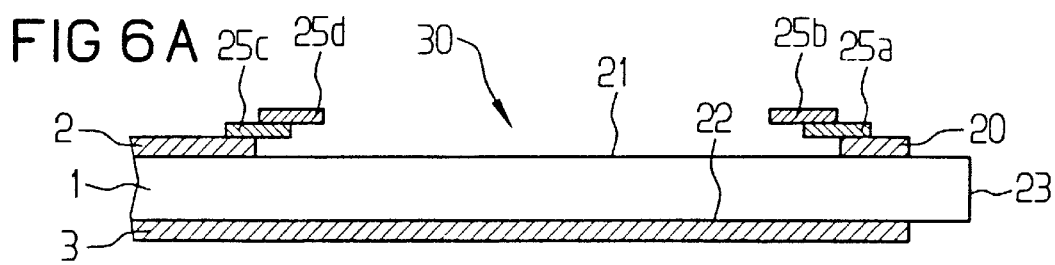
FIGS. 6a–e illustrate, in cross section, preferred embodiments of a substrate with various edge metallizations.
Figure 6B:
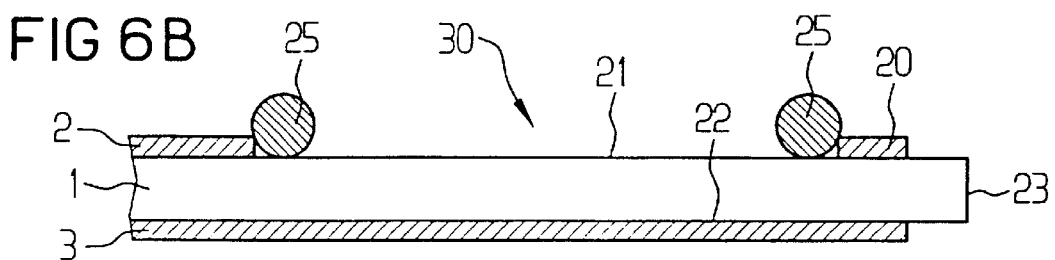
Figure 6C:
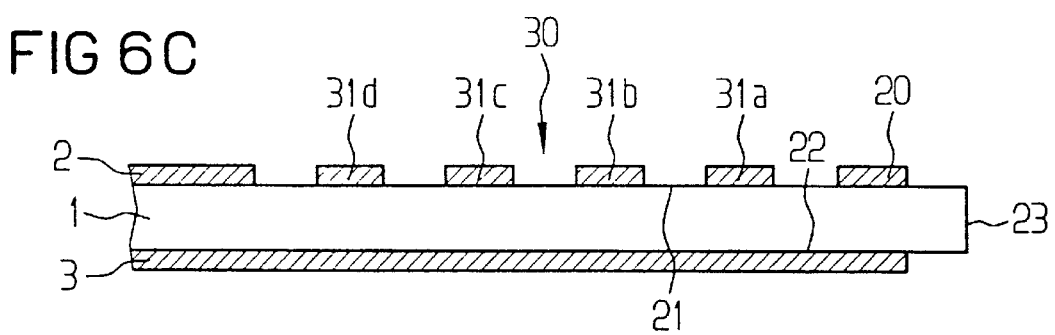

The FIGS. 6a through 6e show various embodiments of the substrate in cross section according to the present invention. The Figures respectively show the ceramic layer 1, the lower metallization 3 and the upper metallization 2. The lateral edge of the upper metal layer 2 is also distanced further from the lateral limit 23 of the ceramic layer 1 than the lateral edge of the lower metal layer 3. An edge metallization 20 is present on the first main side 21 of the ceramic layer 1, this edge metallization (in the present Figures) having the same distance from the lateral limit 23 as the lateral edge of the lower metal layer 3. The lower metal layer 3 need not be deposited as far as up to the edge of the ceramic substrate 1. However, an edge of the lower metal layer 3 that is present far outside is advantageous in terms of manufacturing, since, in particular, the correct fastening of the lower metal layer on the bottom plate 5 by means of the soldered joint 4 can thus be better checked. The edge metallization 20 is at a distance from the lateral edge of the upper metal layer 2 so that a field emission region 30 is formed therebetween. The field emission region 30 defines the transition area of the electrical field from the ceramic layer 1 to the casting compound (not shown) by means of the edge metallization 20, which is electrically connected to the lower metal layer 3 or to the electrically conductive bottom plate 5. Therefore, the field intensity peaks at the edges of the field emission area can be reduced in a simple way. For purposes of reducing the field intensity peaks, a number of possibilities can be conceived with respect to fashioning the edge metallization 20 or the lateral edge of the upper metal layer 2. FIG. 6a provides field plates 25a through 25d in a step-by-step manner in the direction of the field emission region 30. The field plates 25a through 25d are connected to the edge metallization 20 or to the upper metal layer 2 in an electrically conducting manner. In FIG. 6a, the edges are double-graduated. Certainly, it would also be conceivable to select a different number of steps.

Figure 6D:
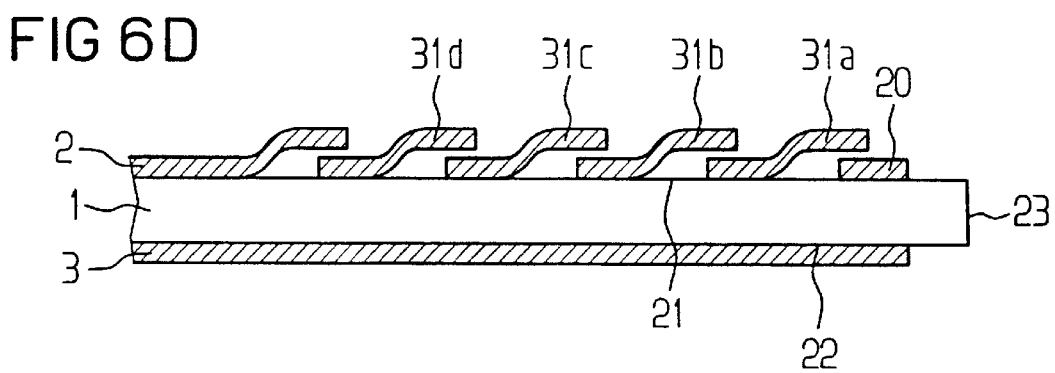
Figure 6E:
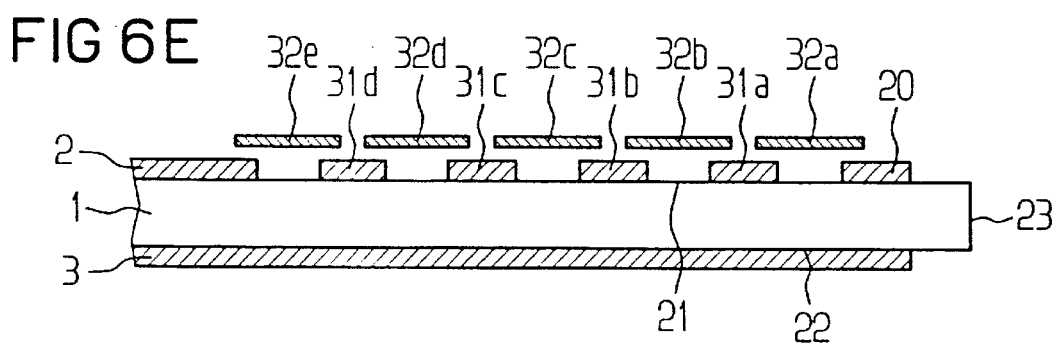

Instead of multiple graduated field plates, a wire ring 25 having an appropriately selected diameter can also be utilized (according to FIG. 6b), which causes a smallest bending radius of the equipotential lines. In the arrangement according to FIG. 6c, field plates 31a through 31d are arranged in the field emission region 30 and are used to effect uniformity of the region 20 of the emission of the field from the ceramic layer 1. The field plates 31a through 31d are spaced at an even distance from one another and are arranged between the edge metallization 20 and the upper metal layer 2 on the first main side 21. Certainly, the number of field plates 31a through 31d may be different from the four field plates shown. FIGS. 6d and 6e show alternative structures with field plates 31a through 31d, which are more intensely capacitively coupled due to their overlap areas. Therefore, a further homogenization of the potential lines is possible. The field plates 32a through 32e of FIG. 6e can be arranged via a dielectric layer, for example, which is deposited on the first main side 21.

While this invention has been described in connection with what are presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A substrate for high-voltage units comprising:
    a ceramic layer having a first main side and a second main side that is opposite to the first main side;
    an upper metal layer disposed on the first main side and a lower metal layer disposed on the second main side;
    a high-impedance layer having at least a portion disposed adjacent to the upper metal layer at the first main side of the ceramic layer, the high-impedance layer also having one of the at least a portion electrically connected to an electrical conductor that is, in turn, electrically connected to the lower metal layer and another portion disposed adjacent to the lower metal layer; and
    the high-impedance layer effecting an electrically conductive path between the upper metal layer and the lower metal layer.

2. The substrate according to claim 1, wherein the high-impedance layer has a conductivity which evenly distributes electrical potential on a surface of the ceramic layer.

3. The substrate according to claim 1, the high-impedance layer has a conductivity which feeds an operating voltage of more than 3 kV.

4. The substrate according to claim 1, wherein the high-impedance layer precludes a magnitude of the electrical field intensity of more than double a maximal value of the electrical field intensity from occurring inside the ceramic layer at lateral edges of the upper metal layer when an electrical potential difference in the range of 3 kV to 10 kV is present between the upper metal layer and the lower metal layer.

5. The substrate according to claim 1, wherein the high-impedance layer limits the electrical field intensity to a maximum of 4V/mm at lateral edges of the upper metal layer when an electrical potential difference in the range of 3 kV to 10 kV is present between the upper metal layer and the lower metal layer.

6. The substrate according to claim 1, wherein the high-impedance layer is comprised of metal.

7. The substrate according to claim 6, wherein the high-impedance layer is comprised of CrNi.

8. The substrate according to claim 1, wherein the high-impedance layer is comprised of an electrically conductive, doped amorphous silicon.

9. The substrate according to claim 1, wherein the high-impedance layer is an electrically conductive, doped amorphous carbon.

10. The substrate according to one of the claim 1, wherein the high-impedance layer is a layer constructed in the ceramic layer and is doped to be electrically conductive.

11. A substrate for high-voltage modules comprising:
    a ceramic layer having a first main side and a second main side that is opposite to the first main side;
    an upper metal layer disposed on the first main side and an lower metal layer disposed on the second main side;
    electrical conductors disposed at the first main side at edges of the upper metal layer, the electrical conductors being increasingly spaced from the ceramic layer with respective increasing distances along a length of the electrical conductors away from the upper metal layer.

12. A substrate for high-voltage modules comprising:
    a ceramic layer having a first main side and a second main side that is opposite to the first main side;
    an upper metal layer disposed on the first main side and a lower metal layer disposed on the second main side;
    an electrically conductive bottom plate that is connected to the ceramic layer via the lower metal layer;
    an edge metallization disposed at a distance from the upper metal layer on the first main side of the ceramic layer, the edge metallization entirely surrounding the upper metal layer to form a field emission area and electrically connected to the lower metal layer through a low-impedance.

13. The substrate according to claim 12, further comprising a circular ring disposed at edges of the upper metal layer and the edge metallization that are facing the field emission region.

14. The substrate according to claim 12, wherein edges of the upper metal layer and the edge metallization that are facing the field emission region are configured as one or more graduated field plates.

15. A substrate according to claim 12, further comprising:
    at least one further metallization disposed in the field emission region and configured for capacitively coupling the upper metal layer and the edge metallization.

16. A substrate according to claim 12, further comprising:
    a high-impedance layer disposed in the field emission region on the first main side adjacent to the upper metal layer and the edge metallization.

* * * * *